(12) United States Patent
McPhillips

(10) Patent No.: US 6,616,890 B2
(45) Date of Patent: Sep. 9, 2003

(54) FABRICATION OF AN ELECTRICALLY CONDUCTIVE SILICON CARBIDE ARTICLE

(75) Inventor: Richard B. McPhillips, Williamsville, NY (US)

(73) Assignee: Harvest Precision Components, Inc., Williamsville, NY (US)

( * ) Notice: Subject to any disclaimer, the term of this patent is extended or adjusted under 35 U.S.C. 154(b) by 0 days.

(21) Appl. No.: 09/882,828

(22) Filed: Jun. 15, 2001

(65) Prior Publication Data

US 2002/0190048 A1 Dec. 19, 2002

(51) Int. Cl.$^7$ .......................... F23Q 7/00; C04B 33/00; H01L 21/338
(52) U.S. Cl. .................. 264/642; 219/270; 423/625; 438/184
(58) Field of Search ................... 219/270, 544, 219/553; 264/642, 682; 501/89, 128; 123/145 A; 423/625; 438/184

(56) References Cited

U.S. PATENT DOCUMENTS

| | | | | |
|---|---|---|---|---|
| 2,837,451 A | * | 6/1958 | Hannon ....................... | 423/625 |
| 2,982,614 A | * | 5/1961 | Csordas et al. ............. | 423/625 |
| 3,875,477 A | * | 4/1975 | Fredriksson et al. ........ | 361/264 |
| 3,968,057 A | * | 7/1976 | Dulin ......................... | 264/642 |
| 4,328,529 A | * | 5/1982 | Hierholzer, Jr. et al. .... | 219/270 |
| 4,701,427 A | | 10/1987 | Boecker et al. | |
| 5,045,237 A | | 9/1991 | Washburn et al. | |
| 5,143,668 A | * | 9/1992 | Hida ......................... | 264/649 |
| 5,322,824 A | | 6/1994 | Chia | |
| 5,804,092 A | | 9/1998 | Axelson et al. | |

FOREIGN PATENT DOCUMENTS

| | | | |
|---|---|---|---|
| JP | 64-72963 | * | 3/1989 |
| JP | 401072963 A | | 3/1989 |
| JP | 4-367563 | * | 12/1992 |
| JP | 8-48571 | * | 2/1996 |
| JP | 8-208318 | * | 8/1996 |
| JP | 408208318 A | | 8/1996 |
| JP | 9-69387 | * | 3/1997 |
| JP | 409069387 A | | 3/1997 |

* cited by examiner

*Primary Examiner*—John A. Jeffery
(74) *Attorney, Agent, or Firm*—Stephen B. Salai, Esq.; Brian B. Shaw, Esq.; Harter, Secrest & Emery LLP

(57) ABSTRACT

A method for fabricating electrically conductive silicon carbide articles by doping and sintering submicron silicon carbide particles using sub-micron alumina as the dopant source. Submicron alumina particles are made by milling aluminum powder. Despite the ductility of metallic aluminum, it is successfully ball milled in an aqueous medium through the creation and abrasion of successive layers of an alumina skin to yield alumina particles as small as 0.01 μm across. When suitably composed mixtures of the silicon carbide and alumina are molded into a green body and heated sufficiently in a non-oxidizing furnace atmosphere, the alumina breaks down to metallic aluminum which diffuses into the silicon carbide. The small particle sizes and the presence of a sintering aid enable rapid processing kinetics which favor saturation of the silicon carbide by the aluminum and inhibit grain growth. Consequently, articles with desirable electrical and mechanical properties can be conveniently and inexpensively made with a mass as small as 2 grams.

21 Claims, 3 Drawing Sheets

FABRICATION OF AN ELECTRICALLY CONDUCTIVE SILICON CARBIDE ARTICLE

FIELD OF THE INVENTION

The invention pertains to the fabrication of electrically conductive silicon carbide articles, and in particular to the fabrication of fully dense and mechanically strong articles.

BACKGROUND OF THE INVENTION

Electrically conductive silicon carbide (SiC) articles are well known, one particularly common application being in gas igniters which use Hot Surface Ignition (HSI). Currently, gas igniters are typically made by loosely sintering relatively coarse (100 to 200 $\mu$m) SiC powders to form a porous matrix, which is then infused with metallic silicon that forms an interstitial network. The electrical conductivity of the resulting composite body is due almost entirely to the interstitial silicon, and the contribution of the SiC itself is insignificant.

Such a structure is prone to fracture, so HSI articles made in this manner are likely to have a high failure rate. The electrical resistance is likely to vary considerably between articles because of inevitable variations in the way the SiC particles pack together. Also, even if the article as a whole remains intact, the interstitial silicon network may yield to internal stresses over time, which will be manifested by a change in electrical resistance. Furthermore, some of the interstitial silicon may diffuse into the SiC over time, which again will show itself as a change in electrical resistance. Additionally, the presence of voids in the final article limits its electrical conductivity to some value below the inherent conductivity of the matrix material.

Despite these disadvantages, the refractory nature of SiC is an attractive property for HSI applications. Such disadvantages would be overcome if the HSI article were made with minimal porosity and if its electrical conductivity resided in the matrix material rather than in an interstitial network. They would be further overcome if voids in the matrix material were largely eliminated, as this would lead to an improved and more consistent electrical conductivity.

Furthermore, if the HSI article owed its conductivity to a conductive dopant species distributed within the entire volume of SiC, its conductivity would be relatively stable over the lifetime of the article, since there would be no driving force to change the dopant distribution and the electrical properties of the article.

Therefore, there is a need for an inexpensive process to fabricate SiC HSI articles which will be resistant to mechanical failure and reliable in operation. There is further a need for an inexpensive process to fabricate such articles as a fully dense, single-phase SiC material which has a stable and improved electrical conductivity. Such a process necessitates minimizing the SiC particle size to accelerate the doping and sintering kinetics. The faster kinetics in turn minimize the opportunity for grain growth in the final product, thus improving its mechanical properties.

Accordingly, it is an object of this invention to provide a method for saturating the silicon carbide with dopant in order to stabilize its electrical properties.

It is another object of this invention to provide a method for making an electrically conductive silicon carbide article from dopant-saturated silicon carbide.

It is yet another object of this invention to provide that the electrically conductive article is made up of submicron-sized grains and is generally void-free.

It is yet another object of this invention to provide an inexpensive method for making such an electrically conductive article.

SUMMARY OF THE INVENTION

When a non-conductive silicon carbide (SiC) particle is reacted at a high temperature under non-oxidizing conditions with a suitable dopant source, it can be converted into an electrically conductive form by the diffusion of a dopant species from the source into the SiC. Possible dopant species include Be, Mg, Ca, Sc, Ti, B, Al, Ga, C, N, P, As, Se, S, Cl, and Br.

In the case of metallic dopant elements, the dopant source is typically a corresponding oxide.

Other refractory (i.e., ceramic) materials besides silicon carbide may be contemplated as the matrix material for practicing this invention, as will be indicated later.

Aluminum is of particular interest as the dopant species for silicon carbide. In principle, metallic aluminum could be used directly as the source. However, aluminum being highly reactive, powders with smaller particle diameters than about 0.1 $\mu$m can be explosive in air and are therefore hazardous to handle.

It is also possible in principle to use aluminum oxide (alumina) as a starting material. However, although submicron alumina powders are commercially available to a degree, they are increasingly expensive and difficult or impossible to obtain as the particle size approaches 0.1 $\mu$m It has been found that aluminum powder sized at around 20 $\mu$m or greater, which is easily handled, can be readily milled in an aqueous medium.

Metallic aluminum is ductile and would not normally be expected to mill satisfactorily. However, a reactive milling regime is established whereby successive layers of an alumina skin are first formed around each aluminum particle by oxidation, and then removed from the particle by abrasion to form alumina particles with diameters typically around 0.01 $\mu$m.

The resulting alumina particles are mixed with submicron SiC powder along with a polymeric organic binder, and portions of the mixture shaped to form a green body. In this disclosure, the term "green" refers to a body that has been shaped but has not been further processed into a durable article. The green body is fired to temperatures high enough to reduce the alumina to aluminum, all of which diffuses into the SiC, and then to promote sintering of the doped SiC.

It is desirable to saturate the SiC with aluminum, for reasons which will become clear. In the context of this disclosure, saturation refers to a generally even distribution of the dopant species through the entire volume of a particle at some equilibrium level that corresponds to the particular processing conditions. Other factors being equal, it takes longer to saturate a large particle than a small one, since diffusion is a rate process initiated at a particle surface and the dopant species must penetrate a greater depth. Also, since the surface/volume ratio of a particle falls with increasing diameter, a given mass of particles has less available surface where diffusion can be initiated. In this context, it will also be appreciated that the alumina particles should be small compared with the SiC particles, since this will distribute the aluminum around the silicon carbide surface, thus allowing Al diffusion to start at many points around the surface. Therefore, in this invention, small (submicron) SiC particle sizes and even smaller alumina particles are selected. The kinetics of the reaction permit the aluminum to essentially saturate the SiC particle. The result is a body composed of a single-phase, Al-saturated Sic.

Along with the processing kinetics, the properties of the final article also are enhanced by using submicron particle sizes. Small raw material particle sizes lead to fine grain diameters in the final product, which are known to improve mechanical properties. Furthermore, grain growth, itself a kinetic process, occurs during sintering. The more rapid the sintering process, the less grain growth occurs. In fact, the grain sizes in the product do not significantly depart from the raw material particle sizes when the sintering time is minimized.

DETAILED DESCRIPTION OF THE INVENTION

Figure 1:
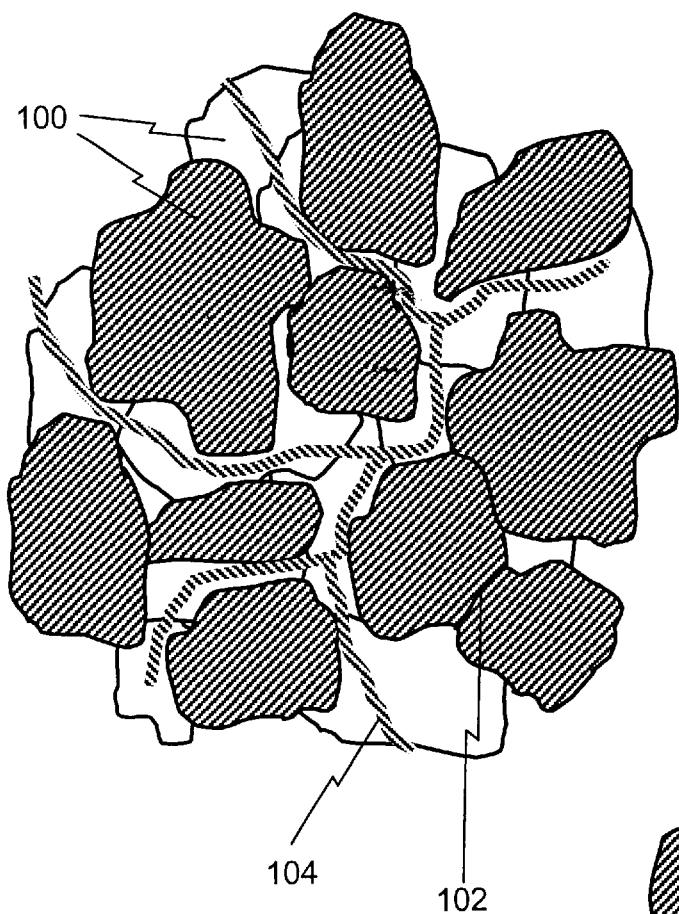
FIG. 1 represents a magnified cross section of a portion of a prior art igniter having voids.

FIG. 1 shows in cross-section a magnified portion of a prior art igniter in which silicon carbide particles 100 are sintered together to form an electrically conductive body having grain boundaries such as 102 but which also having continuous porosity. Typically, the prior art igniter relies for its conductivity on conductive species which are present in the interstices and provide conductive paths such as 104.

Figure 2:
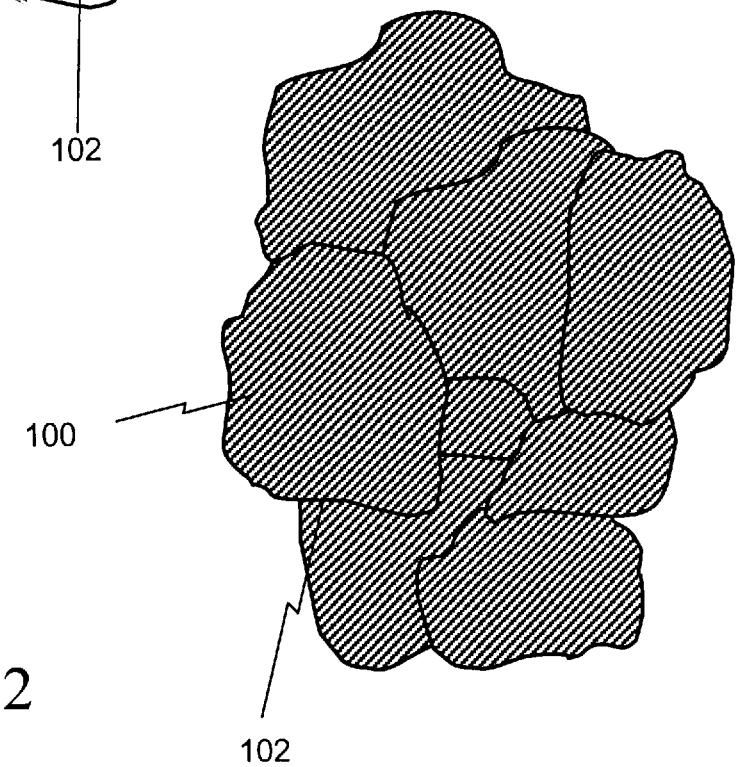
FIG. 2 represents a magnified cross section of a portion of an igniter of this invention.

An electrically conductive silicon carbide (SiC) article is fabricated according to the present invention by a high-temperature firing under non-oxidizing conditions of a green body formed from a particulate mixture containing a non-conductive or minimally conductive SiC, a dopant source, a sintering aid and a binder. The dopant migrates into the SiC particles, which then sinter together to form a single-phase product, a portion of which is shown in cross-section in FIG. 2. Again the SiC particles are fused together at the grain boundaries 102, but interstices or pores are effectively absent.

Although a variety of dopants is available for imparting electrical conductivity to the SiC, the preferred dopant is aluminum (Al). It is well known in the art that Al can replace Si with minimal disturbance to a chemical structure by taking on the electronic structure of Si; in doing so, the Al adds an electron, thus acquiring a single negative charge. This is expressed by the following equation:

(1)

Each negatively charged Al is compensated for by a positive "hole" depicted by the symbol ⊕ in equation 1. As is well known in the art, the positive holes provide a formal mechanism for electrical conductivity, a material with positive holes being known as a "p-type" conductor. In negative or "n-type" conductors, electrons provide the conduction mechanism. As is also well known, conduction can occur when the positive hole or electron has sufficient energy to jump a band-gap between energy levels. The smaller the band-gap, the less energy is required.

The progress of reaction (1) depends on the aluminum diffusing into the SiC. For the reaction to proceed at a reasonable rate, both the SiC and aluminum source must have small, preferably submicron, particle sizes. Submicron aluminum powder itself presents a handling problem, since it can be explosive in air. Therefore, in the present invention, the preferred Al source is alumina ($Al_2O_3$) powder. Conventional milling of coarse alumina to fine is a physical attrition process that requires a considerable energy input; the smaller the current particle size, the more energy is required. One may consider the process in terms of creation of new surface which, for a given mass of material, increases as the inverse square of particle diameter; it is easily seen that each successive unit decrease in particle diameter becomes more costly in energy. An alternative to milling is colloidal formation of the powder, but this also is expensive and precludes particle sizes significantly less than 0.1 μm.

Thus a fabricator has the dilemma that sufficiently fine alumina powders may be prohibitively expensive or commercially unavailable, and fine metallic aluminum powders are a potential hazard in handling. In the present invention, the dilemma is resolved by milling coarse (~20 μm diameter or greater) aluminum particles in an aqueous medium. Aluminum metal is ductile and would not normally be expected to mill satisfactorily. However, since milling proceeds by a reactive mechanism, much of the required energy is supplied chemically rather than mechanically, and the process is much more efficient than a purely mechanical attrition. The reactive milling mechanism can be applicable to other metal powders besides aluminum.

Preferably, milling is done in a rotating mill using hard, dense milling media which can be spherically, cylindrically or otherwise shaped. For example, silicon carbide balls may be used. Chemically, the milling proceeds as follows. Normal aluminum particles have a protective coating of alumina as a result of exposure to air; milling breaks down the coating to expose a fresh aluminum surface which reacts either with water:

(2)

or with oxygen from the air dissolved therein:

(3)

In either case a fresh alumina skin is generated, which breaks down as before. This successive attrition and regeneration of alumina can proceed indefinitely until all the metallic aluminum has been converted to alumina. The particle size of alumina from the abraded skin is independent of the current diameter of the aluminum particles. Rather, it is dependent on the energy of milling, which depends on the rate of milling and the nature of the milling media. A typical particle size for the alumina product of milling is centered around 0.01 μm. Generally, such small particle sizes are achieved by milling energetically enough to abrade away each successive alumina layer before it can become too thick.

Once all the aluminum has been oxidized to alumina, submicron SiC powder is added to the slurry. Optionally, the SiC can be pretreated to remove a surface coating of silica. The pretreatment can either be an acid wash or a heat-treatment in a reducing atmosphere such as forming gas. The slurry is further milled to promote mixing and a sintering aid is added. Usually this is $B_4C$ (boron carbide), although a variety of other sintering aids known in the art can be used. Also, free carbon in the form of carbon black is optionally added. After yet further milling, the slurry is separated from the milling media.

Typically, a polymeric organic binder is used. In a first embodiment of the invention, a polyvinyl acetate (PVA) or polyvinyl butyral (PVB) binder is added to the aqueous slurry to constitute about 4 wt % of the solid ingredients. The slurry is heated to about 200° F. (93° C.) and run through a spray dryer to form a dry feedstock. This can be uniaxially or isostatically pressed into a desired shape to form a green body.

In a second embodiment of the invention, after the slurry is separated from the milling media, it is allowed to settle and excess water is decanted off. The residue is stir-dried over a hot-plate to leave behind a well-mixed reactant powder, which is blended with a small quantity of a proprietary organic binder to form the feedstock which is pelletized and stored. When required for use, the feedstock is heated and mixed in a high shear mixer which converts it to the consistency of a thick bread dough. The addition of a proprietary viscosity control agent reduces the thickness of the mix, successive shots of which are delivered into an injection mold wherein they are shaped to the required green body.

Variants of the milling procedures may be used. In one variant, the alumina product of milling metallic aluminum may be dried and stored before being mixed with other materials. In a preferred variant, the SiC is mixed into the Al slurry before milling the Al to $Al_2O_3$, and in fact assists the milling process.

Figure 3:
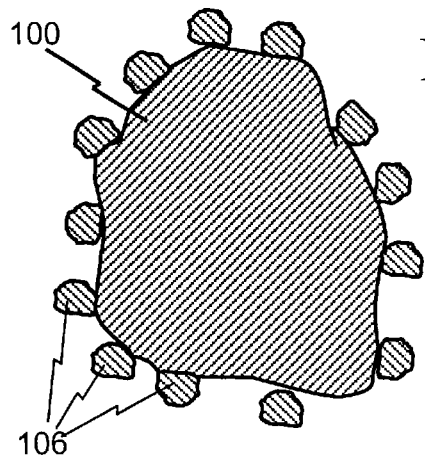
FIG. 3 schematically shows particles of a dopant source around the outside of a silicon carbide particle.

FIG. 3 illustrates relative sizes of the SiC particles 100 and alumina particles 106 prior to their reacting. As was suggested earlier, the alumina particles are small compared with the SiC particles, since this distributes the aluminum around the silicon carbide surface, thus allowing Al diffusion to start at many points around the surface.

The green body is fired under a non-oxidizing atmosphere to produce the desired article such as the igniter. Any conventional furnace that can provide a non-oxidizing atmosphere is suitable for the firing; for example, it can be a gas furnace or an electric furnace, and if electric, it can be resistively or inductively heated. It is preferred to use a resistively heated tube furnace, preferably 3' (0.9 m) long and 1–2" (25–50 mm) in diameter. The tube is purged with preheated argon or nitrogen to provide the non-oxidizing atmosphere, the gas flow being high enough to sweep out any air but low enough to minimize cooling of the furnace.

The article is placed in a refractory container such as a tray which is admitted at one end of the tube and emerges at the opposite end. As is well known, the temperature of a tube furnace typically rises to a maximum in going from either end towards the center. If desired, different portions along the tube can have independent temperature controls, for example to flatten the temperature profile along a substantial length of the tube. By suitably adjusting the furnace controls, a temperature profile is established which matches the requirements of the doping and sintering reactions. In any case, for given control settings, different locations along the tube correspond with particular temperatures. In carrying out the invention, the hottest portion of the furnace is typically set to at least 2050° C.

Although traces of oxygen may survive in the furnace despite purging, the majority originates from the breakdown of alumina:

$$2Al_2O_3 \rightarrow 4Al + 3O_2 \qquad (4)$$

The free carbon referred to earlier is intended as a getter to remove the oxygen by the reaction:

$$C + \tfrac{1}{2}O_2 \rightarrow CO \qquad (5)$$

The carbon requirement of Equation (5) is satisfied by carbon originating from the binder and the free carbon. Therefore, the amount of free carbon can be calculated to complement the amount contributed by the binder. Optionally, the free carbon may be merely sprinkled on the tray.

The article is typically fired according to the following sequence of events. The green body is placed on the tray which is itself placed on a first conveyor belt. Suitable tray materials include graphitic carbon, boron nitride and aluminum nitride. The belt is aligned with the furnace tube and travels towards it at a predetermined speed, depositing the tray on a loading platform at the tube entrance. Each tray is pushed into the tube by the following tray, and thus travels through the furnace at the speed determined by the belt. The binder breaks down and the body shrinks as it travels through a 300 to 900° C. temperature zone. The degree of shrinkage depends on the amount of binder present in the green body; when injection molding has been used the binder level is low and minimal shrinkage occurs. Any residual oxygen in the system reacts either with the binder or with the carbon (either present as the crucible material or added) to form carbon monoxide.

In a 1400 to 1700° C. zone, the alumina decomposes to metallic Al. At the same time, any $SiO_2$ surface coating on the SiC particles breaks down to metallic silicon. The metals begin to diffuse into the SiC matrix. Diffusion is estimated to be complete at about 2050 to 2150° C.

The article spends 5–10 minutes in the hottest zone, 2050 to 2150° C. Here, the boron carbide breaks down to provide free boron as a sintering aid. Free boron may also originate from boron nitride crucibles if they are used. The sintering process effectively fuses together all the individual SiC particles for a given article into a single-phase, essentially void-free body. The sintered article then continues its travel through the furnace and emerges into the air while still quite hot. Its surface is immediately oxidized to form a silica layer a few angstroms thick. Trays emerge from the tube onto a receiving platform and continue onto a second conveyor belt. A given article has spent about 25 minutes in the furnace by the time it emerges. A typical igniter is hairpin-shaped and has a mass in the 2–8 g range. This process would however be suitable for articles up to about 20 g.

Being single-phase, dopant-saturated, fine-grained and essentially void-free, the articles so produced have high strength and low resistivity. Furthermore, the resistively remains stable during the entire lifetime of the article. Resistivity values are typically no greater than 0.1 ohm-cm, well below the 0.5 ohm-cm level typical in prior art igniters.

Although the preferred method of firing is the continuous process just described, a batch process may be used. In this case, a furnace such as a box furnace would be used, with a vacuum purge followed by an argon or nitrogen backfill repeated 2 or more times. The furnace would then be cycled through an appropriate heating program. This would be more appropriate for larger articles, perhaps as heavy as 10 kg.

As suggested above, the continuous process is suitable for fabricating small (2–20 g) parts. It has been found particularly advantageous in making large numbers of small parts to use a bank of several, essentially identical, "small" furnaces rather than scaling up to a single larger furnace, since the greater thermal mass of the larger furnace would make it less responsive to temperature control. Also, a larger furnace would inevitably expose different articles to different thermal histories, which would lead to a less uniform product. All the furnaces could be operated from a common control, while also having the capability of being individually "tuned".

The aluminum (or dopant metal oxide) content of the articles abricated by this invention typically ranges from 0.65 wt % to 1.5 wt %, though it may possibly be as low as 0.3 wt % and as high as 2.5%.

Depending on the particular details of the process, the density of the green body can be in the range 1.8 to 2.7 g/cc. The final article typically ranges from 3.1 to 3.22 g/cc, the upper value being defined by fully dense silicon carbide. There may be occasion to make articles with a controlled porosity, in which case the final density could perhaps be as low as 2.3 g/cc.

A variety of crystal structures exists for SiC, having cubic, hexagonal or rhombohedral symmetry. A common cubic structure is commonly referred to as β-SiC, while several other structures are collectively known as α-SiC.

The starting silicon oxide powder can be α-SiC or β-SiC. The β-SiC is currently preferred, although it is converted to α-SiC under the usual firing conditions. Optionally, the silicon carbide may be pre-treated with an acid wash to remove the $SiO_2$ coating referred to earlier.

The product of this process is a single-phase, essentially void-free, electrically conductive silicon carbide article. The submicron particle size of the SiC starting material allows its relatively fast saturation by the Al dopant.

Figure 4:
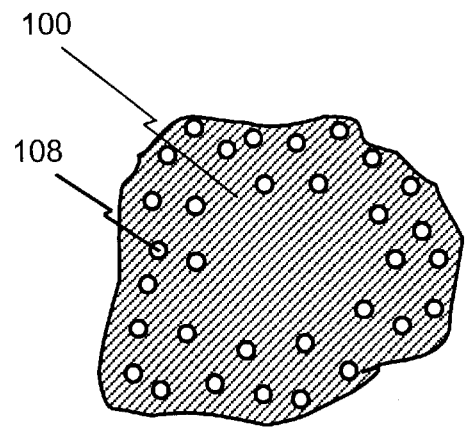
FIG. 4 schematically shows a dopant distribution in an incompletely doped silicon carbide particle.
Figure 5:
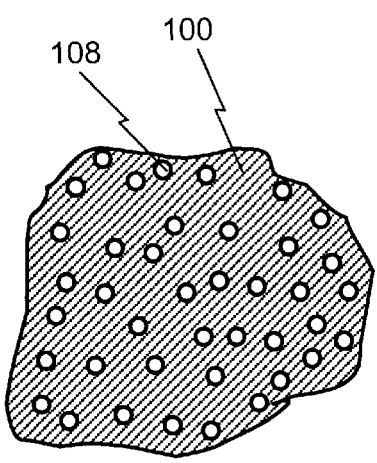
FIG. 5 schematically shows the distribution of the dopant in a dopant-saturated silicon carbide particle.

In the early stages of doping, the dopant 108 is distributed in a given SiC particle 100 as shown schematically in FIG. 4; a portion of the SiC towards the center is still dopant-free. Saturation is illustrated schematically in FIG. 5. Saturation maximizes the electrical conductivity of the doped product, and, by minimizing any Al concentration gradient, essentially removes any potential to destabilize the electrical conductivity over time. The product is thus electrically stable. With an excessive concentration gradient, the high temperature associated with each use of the igniter would promote secondary diffusion of dopant atoms from a higher to a lower concentration region and degrade the electrical conductivity.

Figure 6:
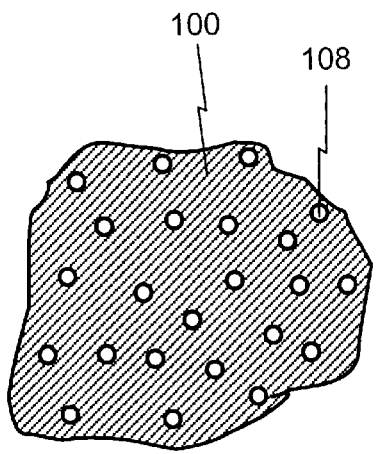
FIG. 6 schematically shows the distribution of the dopant in a silicon carbide particle uniformly doped at some level less than saturation.
Figure 7:
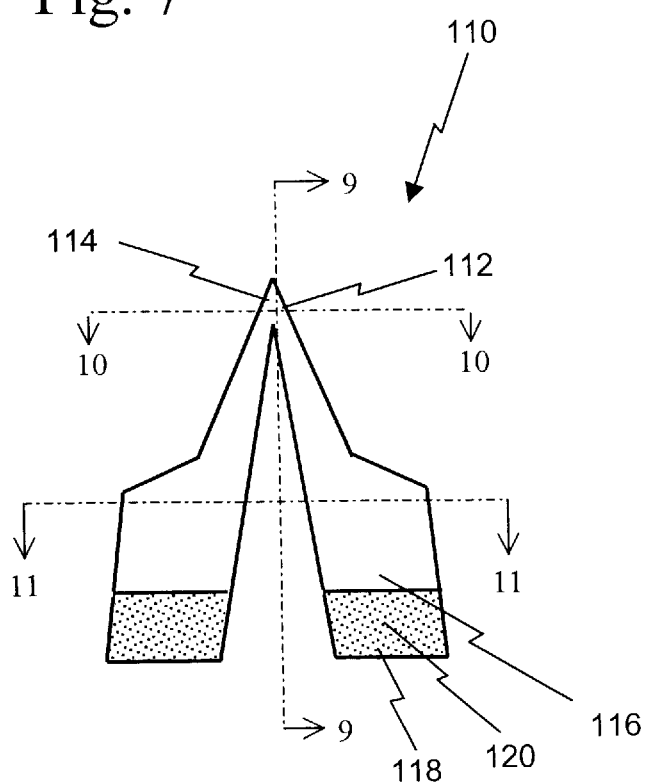
FIG. 7 is a plan view of a first configuration of the igniter of this invention.
Figures 8, 9:
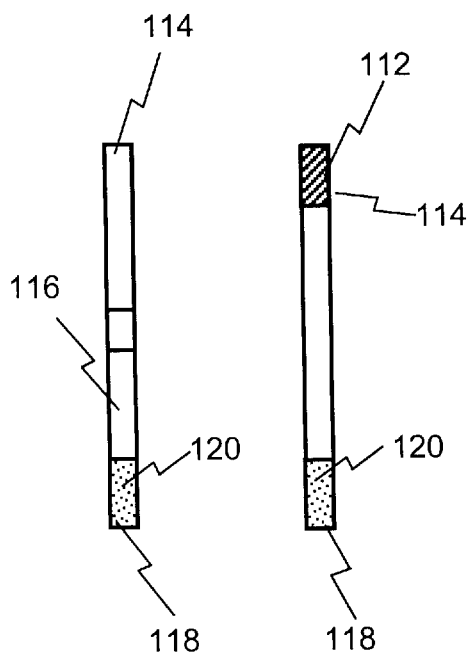
FIG. 8 is a side view of the igniter of FIG. 7
FIG. 9 is a cross section taken across 9—9 of FIG. 7.
Figure 10:
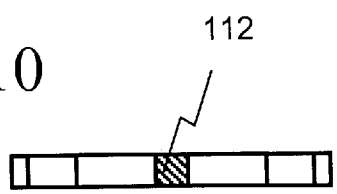
FIG. 10 is cross section taken across 10—10 of FIG. 7.
Figure 11:
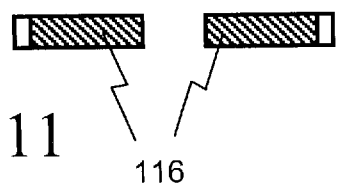
FIG. 11 is cross section taken across 11—11 of FIG. 7.

In this context, it should be borne in mind that the avoidance of a concentration gradient does not strictly require saturation. For some products, it may be useful to have a dopant concentration that is generally uniform at some level less than saturation, as depicted schematically in FIG. 6, which is understood to be drawn to the same scale as FIG. 5. Such a level might be achieved by suitably controlling the process, for example by limiting how much dopant source is originally present. A product made by such a process should be as stable as a dopant-saturated product, albeit at a lower electrical conductivity.

Whether or not saturation exists, uniform distribution of dopant in a finished article is readily tested for by heat-treating it over five heating cycles between room temperature and 1000° C. and comparing its electrical resistivity before and after the heat treatment. If the dopant concentration is uniform, secondary diffusion will not occur, and the resistivity will be unaffected. In each cycle, the article will typically spend 15 minutes at 1000° C., and 5 minutes at room temperature. A typical igniter will over its lifetime be exposed to many heating cycles up to the ignition temperature of gas, and the 1000° C. test temperature is selected as representative of this temperature. This test predicts that the resistivity of the igniter will be generally unchanged over its lifetime, rather than changing with the amount of use.

Beyond selecting submicron SiC for the starting material, one may in particular select the SiC to have a bimodal or trimodal particle size distribution. That is, essentially all the particles would be submicron, but there would be two or three intermixed particle size ranges, each range distributed about a different center. For example, in a bimodal distribution, the smaller particles could be considered fines which could substantially fill the voids between the larger particles prior to any sintering. This would tend to limit the occurrence of voids in the final article even more than would otherwise be the case. It is found that the selection of bimodal or trimodal distributions is particularly advantageous when an injection molding process is to be used The igniter 110 can be configured in a variety of shapes. FIGS. 7–11 show a first configuration of the igniter 110, which is a generally symmetrical A-shaped igniter 110 having a narrow neck 112. Since the neck 112 offers more electrical resistance to the passage of an electric current than any other portion of the igniter, it defines a hot zone 114. To either side of the neck 112, the igniter 110 has comparatively large flat terminal zones 116, each of which has a free end 118 at which it can be secured to an electrical terminal. A metal cladding 120 typically extends from the free end 118 over a portion of each terminal zone 116 to enhance contact with the electrical terminals.

Figure 12:
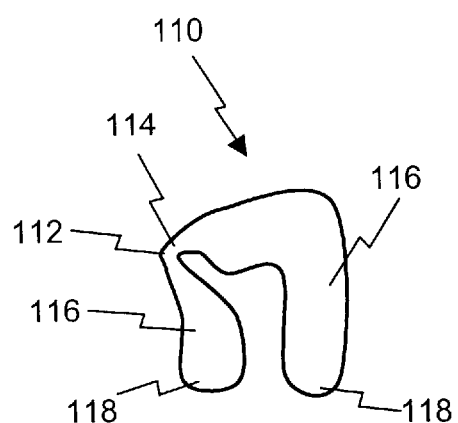
FIG. 12 is a plan view of a second configuration of the igniter of this invention.

A second configuration of the igniter 110 is unsymmetrical, with the hot zone 114 to one side of the igniter 110 as illustrated in FIG. 12. The single-phase, fine-grained composition frees a designer to shape the igniter to any chosen configuration. In the second configuration, the terminal zones 116 are unequally sized, the larger terminal zone 116 having the general shape of an inverted "L". Regardless of how the igniter 110 is configured, the free ends 120 are typically aligned in the same general direction for compatibility with the corresponding electrical terminals.

Depending on how sharply the designer wishes to define the hot zone 114, the neck 112 can be confined to a small portion of the igniter or spread over a larger area. In round numbers, the resistance across the neck 112 should be in the range of about 10 to 50 times the resistance across either of the terminal zones 116.

The small mass of the igniter as described here is enabled by the single-phase, void-free character of the igniter material and its fine grain size. Local stress concentrations are minimized which would otherwise lead to fracture. It is possible therefore to make low-mass, high-strength igniters which can respond to low voltages and heat up rapidly.

The following examples serve to illustrate how the invention is fabricated.

Example 1

20 g of aluminum powder with a particle size >40 μm are put into a 5 gallon (19 l) roller mill with about 8 l of water and milled for 2 h using silicon carbide balls as the milling media. 2 kg of silicon carbide powder with a particle size of about 0.6 μm are added to the resulting slurry. After milling for a further 3 h, 2–3 g of $B_4C$ powder (5 to 20 μm particle size) and 20 g of carbon black are added. After a further period of milling, the slurry is separated from the milling media, heated to 200° F. (93° C.) and run through a spray dryer to form a dry powder. This blended with approximately 80 g of PVA powder. Depending on the desired article, 2–8 g portions of the blend are delivered into a die and uniaxially pressed into a green body. After being expelled from the die, the green body is placed on a refractory tray and passed though an argon atmosphere in a 3' (0.9 m) tube furnace a the rate of about 35 mm per minute, the temperature near the center of the tube being 2050 to 2150° C.

Example 2

20 g of >40 μm aluminum powder, 2 kg of SiC powder and 2–3 g of 5–20 μm $B_4C$ powder with a particle size are put into a 5 gallon (19 l) roller mill with about 8 l of water and milled for 2 h using silicon carbide balls as the milling media. The SiC powder has a trimodal particle size distribution, the uppermost size range being centered around approximately 0.6 μm. A small quantity of a proprietary binder is mixed into the slurry, which is then separated from the milling media, dewatered by settling and decanting, and dried in an evaporating dish on a hotplate. The dried blend can be stored indefinitely if desired. The blend is placed in a heated high-shear mixer in which it is mixed to the consistency of very thick dough. A trace of a viscosity control agent is added to thin the blend to a more workable consistency. 6 g portions of the blend are injected into an injection mold, then released therefrom. The resulting near-net-shape green body is placed on a refractory tray and passed though an nitrogen atmosphere in a 3' (0.9 m) tube furnace a the rate of about 35 mm per minute, the temperature near the center of the tube being 2050 to 2150° C.

In summary, then, this invention provides a rapid method of doping silicon carbide in such a way as to produce an essentially fully dense, single phase, electrically conductive article saturated with the dopant. The invention has the advantage that one can fabricate an electrically stable and mechanically strong igniter at a minimum of expense. The rapidity of the process allows one to minimize the exposure time of the article to the highest process temperatures. The brevity of this exposure results in an article exhibiting little or no grain growth which would adversely affect the quality of the finished article. Silicon carbide grain sizes in the finished article are similar to the initial silicon carbide particle sizes. In particular, submicron silicon carbide particles yield a finished article with grains less than 1 micron across.

The fabrication process is enabled by a convergence of scale factors, namely the relatively small furnace size which allows close temperature control, the low thermal masses of the articles being made which permit their rapid heating and cooling, and the small reactant particle sizes which permit rapid dopant saturation.

While doped SiC is the currently preferred matrix material for the igniter, any of a variety of refractory materials can be contemplated if it can be sintered to a generally void-free, single phase, electrically conductive material. Such materials can for example be silicon nitride, aluminum nitride, zinc oxide, tin (IV) oxide, titanium (IV) oxide, niobium (V) oxide, cerium (IV) oxide, tantalum (V) oxide and various titanates, vanadates, niobates, and tantalates including those of the Group IIA elements of the periodic table. Some of these materials may conduct without the presence of a dopant species, as for example titanium (IV) oxide with an oxygen deficiency induced by reducing conditions; others could be doped similarly to the silicon carbide, as for example zinc oxide dopable with Mn, Ni, Co or Bi, or tin (IV) oxide dopable with F or In.

Most typically, an igniter would be formed from a material that is dopable and sinterable to produce a single-phase, fine-grained, void-free conductive body. Such a material would normally be a refractory carbide, oxide or nitride.

The small size of the igniter of the present invention provides several advantages. The igniter can be fabricated more rapidly and therefore less expensively than previous igniters. It requires less electrical power to operate, while being able to heat up more rapidly to its required use temperature.

Compared to prior art igniters, the present igniter can be introduced into more compact spaces, it can be operated within a wider range of voltages (2–500 V DC/AC compared with 12–120 V DC/AC) and has much lower power consumption (1–2 W compared with 50–70 W). It can heat up more rapidly to its required use temperature. It lends itself to being powered by conventional household batteries, and can thus be incorporated into a portable device. In particular, such a device can be an easily portable source of infrared radiation, which could for example be used as an infrared signalling device.

While the invention has been described with reference to certain embodiments, it will be understood by those skilled in the art that various changes may be made and equivalents may be substituted for elements thereof without departing from the scope of the invention. In addition, many modifications may be made to adapt a particular situation of material to the teachings of the invention without departing from the scope of the invention. Therefore, it is intended that the invention not be limited to the particular embodiments disclosed as the best mode contemplated for carrying out this invention, but that the invention will include all embodiments falling within the scope and spirit of the appended claims.

I claim:

1. A method of making an aluminum-doped silicon carbide article, the article being substantially single-phase and generally void-free, the method comprising:
   (a) forming an alumina powder having predominantly submicron particle diameters;
   (b) selecting a submicron silicon carbide powder;
   (c) mixing the silicon carbide and alumina powders with an organic binder not substantially exceeding 4 wt %;
   (d) forming a green body from the mixture; and
   (e) heating the green body in a non-oxidizing atmosphere.

2. The method of claim 1, wherein forming the alumina powder includes sequentially producing and then abrading an alumina skin on each of a plurality of aluminum particles.

3. The method of claim 2, wherein sequentially producing and then abrading the alumina skin includes milling the aluminum particles in the presence of the silicon carbide powder.

4. The method of claim 1, further comprising selecting the aluminum content of the article to be in a range from 0.65 to 1.5 wt %.

5. The method of claim 1, further comprising selecting the aluminum content of the article to be in a range from 0.3 to 2.5% wt %.

6. The method of claim 1, further comprising including a sintering aid in the blend.

7. The method of claim 6, further comprising selecting boron carbide as the sintering aid.

8. The method of claim 6, further comprising selecting the boron carbide to constitute 0.1 to 0.15 wt % of the blend.

9. The method of claim 1, further comprising including a carbon powder in the blend.

10. The method of claim 1, including forming the alumina powder to have a particle size predominantly smaller than that of the selected silicon carbide powder.

11. The method of claim 1, including forming the alumina powder to have a particle size predominantly of the order of 0.01 µm.

12. The method of claim 11 further comprising heating the green body to at least 2050° C. for no more than 10 minutes.

13. The method of claim 11 further comprising heating the green body to at least 2050° C. for no more than 5 minutes.

14. The method of claim 1 further comprising heating the green body to a temperature of at least 2050° C.

15. The method of claim 1, wherein the step of forming the green body comprises one of uniaxially and isostatically pressing the mixture.

16. The method of claim 1, wherein the step of forming the green body comprises injection molding the mixture.

17. The method of claim 16, wherein injection molding the mixture includes adding a viscosity control agent to the mixture.

18. The method of claim 1, further comprising selecting the silicon carbide powder to have one of a bimodal and a trimodal distribution of particle sizes.

19. A method of making a doped silicon carbide article, the article being substantially single-phase and generally void-free, the method comprising:
   (a) forming a powder of a dopant source, the powder having a predominantly submicron particle diameter;
   (b) selecting a submicron silicon carbide powder;
   (c) mixing the silicon carbide and dopant-source powders with an organic binder not substantially exceeding 4 wt %;
   (d) forming a green body from the mixture; and
   (e) firing the green body in a non-oxidizing atmosphere.

20. The method of claim 19, comprising selecting the dopant from a group including Be, Mg, Ca, Sc, Ti, B, Al, Ga, C, N, P, As, Se, S, Cl, and Br.

21. The method of claim 19, comprising selecting a metal oxide as the dopant source.

* * * * *